US009355857B2

(12) United States Patent
Jeon et al.

(10) Patent No.: US 9,355,857 B2
(45) Date of Patent: May 31, 2016

(54) SUBSTRATE MANUFACTURING METHOD AND SUBSTRATE MANUFACTURING APPARATUS

(71) Applicant: SAMSUNG ELECTRONICS CO., LTD., Gyeonggi-do (KR)

(72) Inventors: Kangmin Jeon, Gyeonggi-do (KR); Kyung-Sun Kim, Gyeonggi-do (KR); Dougyong Sung, Seoul (KR); Tae-Hwa Kim, Gyeonggi-do (KR); Heungsik Park, Gyeonggi-do (KR); Jung Min Kim, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/678,491

(22) Filed: Apr. 3, 2015

(65) Prior Publication Data

US 2016/0027652 A1    Jan. 28, 2016

(30) Foreign Application Priority Data

Jul. 23, 2014  (KR) .................. 10-2014-0093323

(51) Int. Cl.
| | |
|---|---|
| *H01L 21/31* | (2006.01) |
| *H01L 21/3065* | (2006.01) |
| *H01L 21/02* | (2006.01) |
| *H01L 21/311* | (2006.01) |
| *H01L 21/67* | (2006.01) |
| *H01J 37/32* | (2006.01) |

(52) U.S. Cl.
CPC ....... *H01L 21/3065* (2013.01); *H01J 37/32449* (2013.01); *H01J 37/32834* (2013.01); *H01J 37/32889* (2013.01); *H01L 21/02118* (2013.01); *H01L 21/02274* (2013.01); *H01L 21/31138* (2013.01); *H01L 21/67069* (2013.01); *H01J 2237/332* (2013.01); *H01J 2237/334* (2013.01)

(58) Field of Classification Search
CPC  C23C 16/52; C23C 16/455; C23C 16/45561; C23C 16/45523; G05D 7/0635; G05D 7/0658; H01J 37/3244; H01J 37/32449; H01L 21/31
See application file for complete search history.

(56) References Cited

U.S. PATENT DOCUMENTS

| | | | |
|---|---|---|---|
| 6,924,235 | B2 | 8/2005 | Johnson et al. |
| 8,202,393 | B2 | 6/2012 | Wong et al. |
| 8,313,611 | B2 | 11/2012 | Larson |
| 8,343,876 | B2 | 1/2013 | Sadjadi et al. |

(Continued)

FOREIGN PATENT DOCUMENTS

| | | |
|---|---|---|
| KR | 1020110091352 | 8/2011 |
| KR | 1020120091564 | 8/2012 |
| KR | 1020130124998 | 11/2013 |

*Primary Examiner* — Jaehwan Oh
(74) *Attorney, Agent, or Firm* — F. Chau & Associates, LLC

(57) ABSTRACT

Provided are a substrate manufacturing method and a substrate manufacturing apparatus used therefor. The substrate manufacturing method includes providing a substrate having a mask film into a chamber. A plasma reaction is induced in the chamber. A first gas and a second gas are alternately provided into the chamber to etch the substrate. Each of the first and second gases is provided into the chamber at a stabilized feed pressure including a pressure fluctuation profile comprising a square wave shape.

14 Claims, 14 Drawing Sheets

(56) References Cited

U.S. PATENT DOCUMENTS

| | | |
|---|---|---|
| 8,367,566 B2 | 2/2013 | Sano et al. |
| 8,491,805 B2 | 7/2013 | Kushibiki et al. |
| 8,601,976 B2 * | 12/2013 | Nishino ............... C23C 16/455 |
| | | 118/663 |
| 2006/0172442 A1 * | 8/2006 | Okabe ..................... G01F 1/68 |
| | | 438/14 |
| 2008/0017105 A1 | 1/2008 | Moriya et al. |
| 2009/0061541 A1 * | 3/2009 | Moriya ................. C23C 16/455 |
| | | 438/10 |
| 2009/0130859 A1 * | 5/2009 | Itatani ................ C23C 17/0272 |
| | | 438/778 |
| 2012/0305188 A1 * | 12/2012 | Kato .................... H01J 37/3244 |
| | | 156/345.26 |

* cited by examiner

SUBSTRATE MANUFACTURING METHOD AND SUBSTRATE MANUFACTURING APPARATUS

CROSS-REFERENCE TO RELATED APPLICATIONS

This U.S. non-provisional patent application claims priority under 35 U.S.C. §119 to Korean Patent Application No. 10-2014-0093323, filed on Jul. 23, 2014, the disclosure of which is incorporated by reference herein in its entirety.

TECHNICAL FIELD

Exemplary embodiments of the present inventive concept relate to a manufacturing method and a manufacturing apparatus, and more particularly, to a semiconductor substrate manufacturing method and a substrate manufacturing apparatus.

DISCUSSION OF RELATED ART

In general, a semiconductor device may be formed through unit processes such as a deposition process and an etching process. The deposition process and the etching process may use a plasma reaction. For example, a dry etching process may form a semiconductor device by using a plasma reaction. A three-dimensional semiconductor device such as a V-NAND flash device may be formed by an etching process including a gas pulsing process.

SUMMARY OF THE INVENTION

Exemplary embodiments of the present inventive concept provide a substrate manufacturing method and a substrate manufacturing apparatus which may reduce or prevent an occurrence of a defect in a plasma reaction.

Exemplary embodiments of the present inventive concept provide a substrate manufacturing method and a substrate manufacturing apparatus which may induce a plasma reaction under a stabilized feed pressure.

Exemplary embodiments of the present inventive concept provide a substrate manufacturing method including providing a substrate having a mask film into a chamber. A plasma reaction is induced in the chamber. A first gas and a second gas are alternately provided into the chamber to etch the substrate. Each of the first and second gases is alternately provided into the chamber at a stabilized feed pressure. The stabilized feed pressures of the first and second gases have a substantially square wave transition profile.

In some exemplary embodiments of the present inventive concept, providing the first gas and the second gas includes providing the first gas to the substrate at a first pressure to deposit a polymer on the substrate and providing the second gas onto the substrate at a second pressure which is different from the first pressure to etch the polymer and the substrate. The first gas and the second gas may be provided according to the cross-feed feed pressure pulse having a square-wave shape corresponding to a difference between the first and second pressures.

The cross-feed feed pressure pulse may include an initial feed pressure value and a final feed pressure value of each of the first and second gases. When the cross-feed feed pressure pulse has the square-wave shape, the initial feed pressure value may be equal to the final feed pressure value.

In exemplary embodiments of the present inventive concept, a substrate manufacturing apparatus includes a chamber, and first and second gas supply units configured to provide first and second gases into the chamber, respectively. First and second supply pipes connect the first and second gas supply units to the chamber, respectively. A pump is configured to pump the first and second gases into the chamber. An exhaust pipe connects the pump and the chamber. First and second bypass pipes are branched off from the first and second supply pipes, and are respectively connected to the exhaust pipes to bypass the chamber. First and second main supply valves are disposed on the first and second supply pipes between the chamber and the first and second bypass pipes. The first and second main supply valves are configured to turn on and off a supply of the first and second gases, respectively. First and second relief valves are disposed on the first and second bypass pipes, respectively. The first and second relief valves are configured to reduce a decrease in an exhaust pressure of each of the first and second gases in the first and second bypass pipes. The first and second relief valves are configured to stabilize a feed pressure of each of the first and second gases to have a substantially square wave transition profile.

In some exemplary embodiments of the present inventive concept, the substrate manufacturing apparatus may include first and second bypass valves disposed on the first and second bypass pipes between the first and second supply pipes and the first and second relief pipes, respectively. The first and second bypass valves are configured to turn on and off an exhaust of the first and second gases discharged to the first and second bypass pipes, respectively. The first and second relief valves may reduce a decrease in an exhaust pressure of each of the first and second gases in the first and second supply pipes, respectively.

BRIEF DESCRIPTION OF THE DRAWINGS

The above and other features of the present inventive concept will become more apparent by describing in detail exemplary embodiments thereof, with reference to the accompanying drawings in which.

DETAILED DESCRIPTION OF THE EMBODIMENTS

Figure 1:
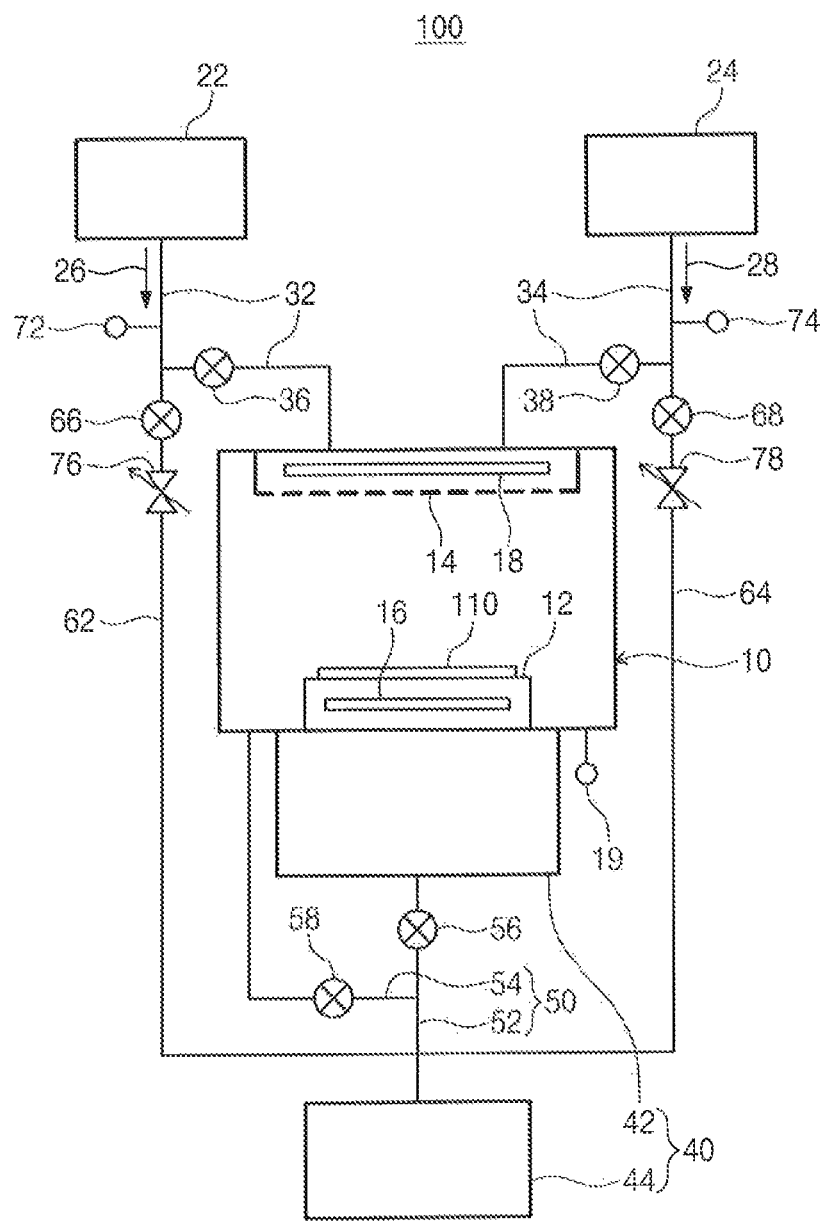
FIG. 1 illustrates a substrate manufacturing apparatus according to an exemplary embodiment of the present inventive concept.

Aspects and features of the exemplary embodiments of the present inventive concept, and implementation methods thereof will be described in more detail in the following exemplary embodiments described with reference to the accompanying drawings. The present inventive concept may, however, be embodied in many different forms and should not be construed as being limited to the exemplary embodiments set forth herein. Like reference numerals may refer to like elements throughout the specification and drawings.

In the specification, it will be understood that when a valve or a temperature sensor is referred to as being 'on' a pipe, it may be directly on the pipe, or connected between pipes. Although terms such as a first and a second may be used to describe various members, components, regions, layers, and/or portions in the exemplary embodiments of the present inventive concept, the members, components, regions, layers, and/or portions are not limited to these terms.

The use of technical terms may be used for explaining a specific exemplary embodiment of the present inventive concept; however, exemplary embodiments of the present inventive concept are not limited by such technical terms.

The exemplary embodiments of the present inventive concept may be described with sectional views arid/or plain views as exemplary views of the present inventive concept. The dimensions of layers and regions may be exaggerated for clarity of illustration. Accordingly, shapes of the exemplary views may be modified according to manufacturing techniques and/or allowable errors. Therefore, exemplary embodiments of the present inventive concept are not limited to specific shapes illustrated in the exemplary views, but may include other shapes that may be created, for example, according to manufacturing processes.

FIG. 1 illustrates a substrate manufacturing apparatus according to an exemplary embodiment of the present inventive concept. A substrate manufacturing apparatus 100 may include first and second gas supplying units 22 and 24, first and second supply pipes 32 and 34, first and second main supply valves 36 and 38, pumps 40, exhaust pipes 50, first and second bypass pipes 62 and 64, and first and second relief valves 76 and 78.

A chamber 10 may include an inner space separated from the outside. A substrate 110 may be disposed in the chamber 10. The chamber 10 may allow the substrate 110 to be in a vacuum state. The chamber 10 may include an electrostatic chuck 12, a shower head 14, first and second electrodes 16 and 18, and a chamber pressure sensor 19. The electrostatic chuck 12 may be disposed in a lower portion of the chamber 10. The electrostatic chuck. 12 may fix the substrate 110 in a desired location in the chamber 10. The shower head 14 may be disposed in an upper portion of the chamber 10. The shower head 14 may inject a first gas 26 and a second gas 28 onto the substrate 110. The first electrode 16 may be disposed in the electrostatic chuck 12. The second electrode 18 may be disposed in the shower head 14. High-frequency power may be applied to each of the first and second electrodes 16 and 18. The high-frequency power may induce a plasma reaction of the first gas 26 and the second gas 28. A chamber pressure sensor 19 may detect an internal pressure of the chamber 10.

The first and second gas supplying units 22 and 24 may provide the first and second gases 26 and 28 to the chamber 10, respectively. According to an exemplary embodiment of the present inventive concept, the first and second gases 26 and 28 may be etching gases. The etching gases may be injected onto the substrate 110. The first and second gases 26 and 28 may have different etching characteristics from each other with respect to the substrate 110.

The first and second supply pipes 32 and 34 may connect the first and second gas supply units 22 and 24 to the chamber 10, respectively. For example, the first and second supply pipes 32 and 34 may include plastic, Teflon, or stainless steel which may be resistant to corrosion that may be caused by the first and second gases 26 and 28. The first supply pipe 32 may have a same diameter as a diameter of the second supply pipe 34. The first and second supply pipes 32 and 34 may have different diameters from each other. For example, the first and second supply pipes 32 and 34 may have different diameters according to a feed flow rate and/or pressure of the first and second gases 26 and 28. For example, when the feed flow rate of the first gas 26 is greater than that of the second gas 28, the diameter of the first supply pipe 32 may be larger than that of the second supply pipe 34.

The first and second main supply valves 36 and 38 may be disposed on the first and second supply pipes 32 and 34, respectively. The first and second main supply valves 36 and 38 may turn a supply of the first and second gases 26 and 28 in the first and second supply pipes 32 and 34, respectively, on and off. According to an exemplary embodiment of the present inventive concept, the first and second main supply valves 36 and 38 may be opened and closed. For example, the first and second main supply valves 36 and 38 may be opened and closed alternately. For example, when the first main supply valve 36 is opened, the second main supply valve 38 may be closed. The first gas 26 may be provided into the chamber 10. When the first main supply valve 36 is closed, the second main supply valve 38 may be opened. The second gas 28 may be provided into the chamber 10. For example, the first gas 26 and the second gas 28 may be alternately provided into the chamber 10. This process may be referred to as a gas pulsing process.

The pumps 40 may pump the first and second gases 26 and 28 into the chamber 10. According to an exemplary embodiment of the present inventive concept, the pumps 40 may include a high vacuum pump 42 and a low vacuum pump 44. The high vacuum pump 42 may be connected to the chamber 10. The high vacuum pump 42 may include a turbo pump. The low vacuum pump 44 may include a dry pump. The low vacuum pump 44 may be connected to a scrubber (not shown). The scrubber may refine the first and second gases 26 and 28.

The exhaust pipe 50 may exhaust the first and second gases 26 and 28 in the pumps 40. According to an exemplary embodiment of the present inventive concept, the exhaust pipe 50 may include a main exhaust pipe 52 and a roughing pipe 54. The main exhaust pipe 52 may connect the high vacuum pump 42 to the low vacuum pump 44. The roughing pipe 54 may directly connect the chamber 10 to the main exhaust pipe 52. A main exhaust valve 56 may be disposed on the main exhaust pipe 52. The main exhaust pipe 56 may be disposed between the roughing pipe 54 and the high vacuum pump 42. The main exhaust valve 56 may turn a flow of exhaust including the first and second gases 26 and 28 in the main exhaust pipe 52 on and off. A roughing exhaust valve 58 may be disposed on the roughing pipe 54. The roughing exhaust valve 58 may turn a flow of exhaust including the first and second gases 26 and 28 in the roughing pipe 54 on and off.

The roughing exhaust valve 58 and the main exhaust valve 56 may be opened and closed alternately. An exhaust pressure regulating valve (not shown) may be disposed on the main exhaust pipe 52. The exhaust pressure regulating valve may be disposed between the high vacuum pump 42 and the main exhaust valve 56. The exhaust pressure regulating valve may regulate an exhaust pressure in the exhaust pipe 50 and may adjust an internal pressure of the chamber 10.

The first and second bypass pipes 62 and 64 may connect the first and second supply pipes 32 and 34 to the exhaust pipe 50, respectively. The first and second gases 26 and 28 in the first and second bypass pipes 62 and 64 need not be provided into the chamber 10. The first and second gases 26 and 28 in the first and second bypass pipes 62 and 64 may be directly exhausted to the exhaust pipe 50 from the first and second supply pipes 32 and 34. According to an exemplary embodiment of the present inventive concept, the first bypass pipe 62 may be branched off from the first supply pipe 32 and may be connected to the main exhaust pipe 52. The second bypass pipe 64 may be branched off from the second supply pipe 34 and may be connected to the main exhaust pipe 52. The first and second bypass pipes 62 and 64 may be connected to the exhaust pipe 50, which may be disposed between the low vacuum pump 44 and the roughing pipe 54.

First and second bypass valves 66 and 68 may be disposed on the first and second bypass pipes 62 and 64, respectively. The first and second bypass valves 66 and 68 may turn a flow of exhaust including the first and second gases 26 and 2.8 in the first and second bypass pipes 62 and 64, respectively, on and off. For example, the first and second bypass valves 66 and 68 may be opened and closed alternately. The first and second bypass valves 66 and 68 and the first and second main supply valves 36 and 38 may be opened and closed such that they are interlocked with each other. The first main supply valve 36 and the first bypass valve 66 may be opened and closed alternately or at the same time. The second main supply valve 38 and the second bypass valve 68 may be opened and closed alternately or at the same time. The first main supply valve 36 and the second bypass valve 68 may be opened and closed an equal amount at the same time. The second main supply valve 38 and the first bypass valve 66 may be opened and closed an equal amount at the same time.

First and second pipe pressure sensors 72 and 74 may be disposed on the first and second supply pipes 32 and 34. The first and second pipe pressure sensors 72 and 74 may be disposed between the first and second gas supply units 22 and 24 and the first and second bypass pipes 62 and 64, respectively. The first and second pipe pressure sensors 72 and 74 may measure pressures of the first and second gases 26 and 2.8 in the first and second supply pipes 32 and 34, respectively.

Each of the pressures of the first and second gases 26 and 28 in the first and second supply pipes 32 and 34 may be changed by opening and closing the first and second main supply valves 36 and 38. For example, when the first and second main supply valves 36 and 38 are closed, a first pipe pressure of each of the first and second supply pipes 32 and 34 may be higher than an internal pressure of the chamber 10. When the first and second main supply valves 36 and 38 are opened, the first and second gases 26 and 28 of high pressure may be provided into the chamber 10. The internal pressure of the chamber 10 may be changed by the first and second gases 26 and 28 of high pressure. The first gas 26 and the second gas 28 may be alternately provided into the chamber 10.

Figure 2:
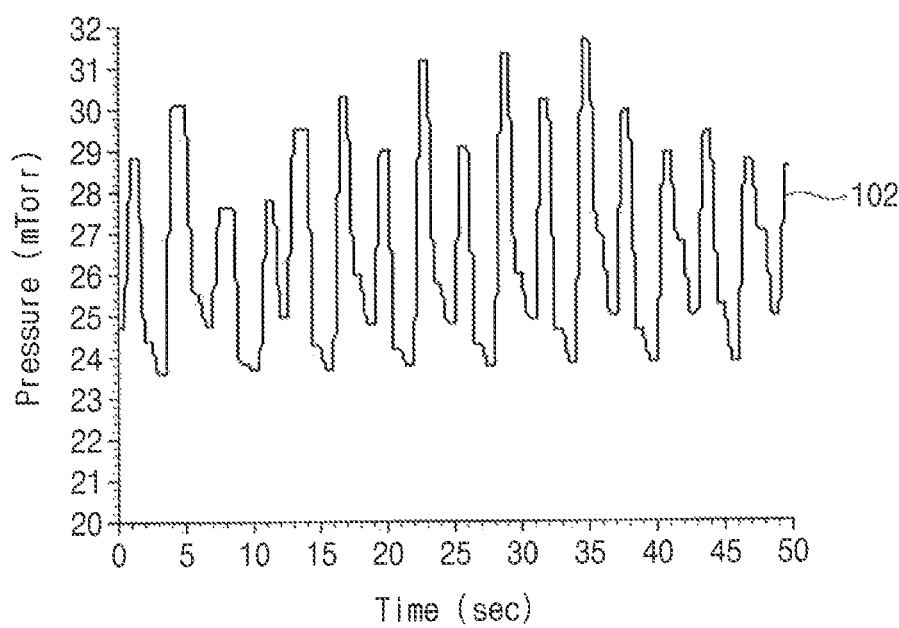
FIG. 2 is a graph showing a pressure change in a chamber as first and second gases of high pressure are supplied.

FIG. 2 illustrates a pressure change in the chamber 10 as the first and second gases 26 and 28 of high pressure are provided. When the first and second main supply valves 36 and 38 are opened, the first and second gases 26 and 28 may be provided as a cross-feed pressure pulse 102. The pressure of the cross-feed pressure pulse 102 may fluctuate up and down. For example, the pressure change in the chamber 10 may fluctuate up and down when each of the first and second gases 26 and 28 is provided. Supply pulses of the first gas 26 and the second gas 28 may have upper and lower peaks. A pressure difference between the first and second gases 26 and 28 in the first and second supply pipes 32 and 34 may be relatively high.

A pressure difference between the first and second supply pipes 32 and 34 and the chamber 10 may be partially reduced by opening and closing the first and second bypass valves 66 and 68. This may occur because the first and second gases 26 and 28 are exhausted through the first and second bypass pipes 62 and 64, respectively.

A pressure difference between the first and second gases 26 and 28 need not be eliminated. When the first and second bypass valves 66 and 68 are opened (e.g., because of a pumping pressure of the low vacuum pump 44) a second pipe pressure of each of the first and second supply pipes 32 and 34 may be temporarily decreased to a lower pressure (e.g., lower than the internal pressure of the chamber 10). The pumping pressure of the low vacuum pump 44 may be lower than the internal pressure of the chamber 10. When the first and second main supply valves 36 and 38 are opened, the first and second gases 26 and 28 may be provided into the chamber 10.

Figure 3:
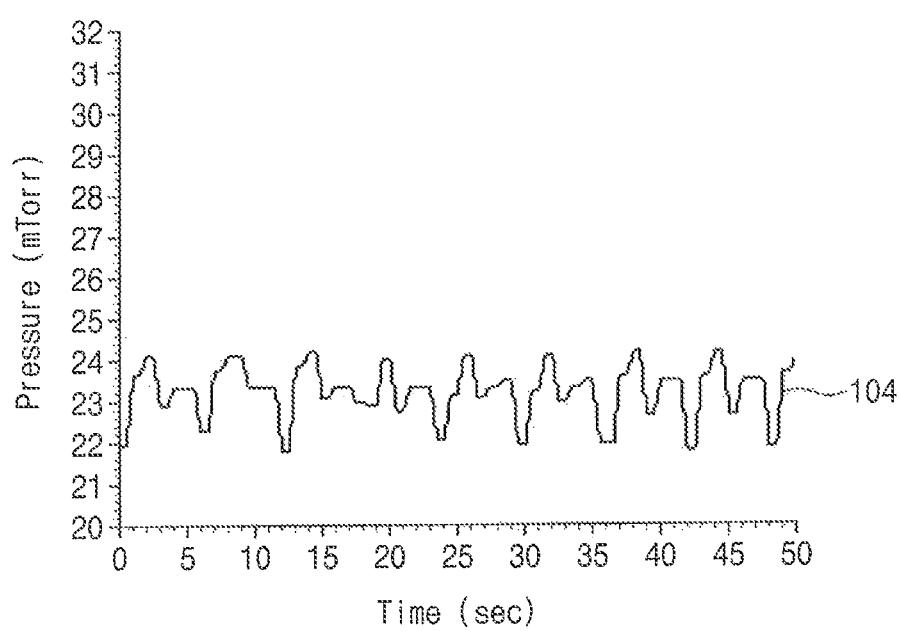
FIG. 3 is a graph showing a pressure change in the chamber as first and second gases of low pressure are supplied.

FIG. 3 shows a pressure change in the chamber 10 as the first and second gases 26 and 28 of low pressure are provided. When the first and second main supply valves 36 and 38 and the first and second bypass valves 66 and 68 are opened and closed, the first and second gases 26 and 28 may be provided as a cross-feed pressure pulse 104. The cross-feed pressure pulse 104 may fluctuate up and down. The cross-feed pressure pulse 104 may have downward peaks. When the first and second gases 26 and 28 of low pressure are provided, an internal pressure of the chamber 10 may be decreased. An initial feed pressure of each of the first and second gases 26 and 28 in the first and second supply pipes 32 and 34 may be lower than the internal pressure of the chamber 10.

Referring to FIG. 1, the first and second relief valves 76 and 78 may be disposed on the first and second bypass pipes 62 and 64. The first and second relief valves 76 and 78 may be disposed between the first and second bypass valves 66 and 68 and the exhaust pipe 50. When the first and second bypass valves 66 and 68 are opened, the first and second relief valves 76 and 78 may eliminate and/or reduce a decrease in an exhaust pressure of each of the first and second gases 26 and 28 in the first and second supply pipes 32 and 34. Accordingly, the first and second relief valves 76 and 78 may reduce or eliminate a pressure difference between the first and second supply pipes 32 and 34 and the chamber 10. According to an exemplary embodiment of the present inventive concept, each of the first and second relief valves 76 and 78 may include a pressure regulating valve. The first and second relief valves 76 and 78 may stabilize feed pressures of the first and second gases 26 and 28 in the first and second supply pipes 32 and 34 similarly to the internal pressure of the chamber 10. The initial feed pressure of each of the first and second gases 26 and 28 may be similar to the internal pressure of the chamber 10. The first and second gases 26 and 28 of a stabilized initial feed pressure may reduce or prevent an occurrence of a plasma reaction defect.

Figure 4:
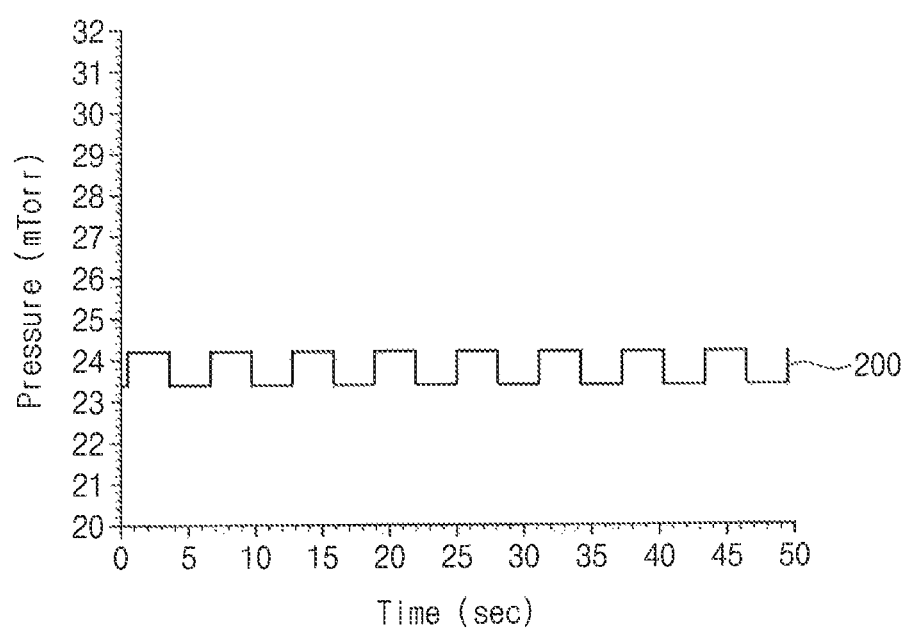
FIG. 4 is a graph showing a pressure change in the chamber as first and second gases of a stabilized feed pressure are supplied.

FIG. 4 shows a pressure change in the chamber 10 as the first and second gases 26 and 28 of a stabilized feed pressure are supplied. The first and second gases 26 and 28 may be provided as a stabilized cross-feed pressure pulse 200. The stabilized cross-feed pressure pulse 200 may uniformly appear without peaks. According to an exemplary embodiment of the present inventive concept, the stabilized cross-feed pressure pulse 200 may have the shape of a substantially square wave.

The first and second relief valves 76 and 78 may be interlocked with the first and second pipe pressure sensors 72 and 74, respectively.

Figure 5:
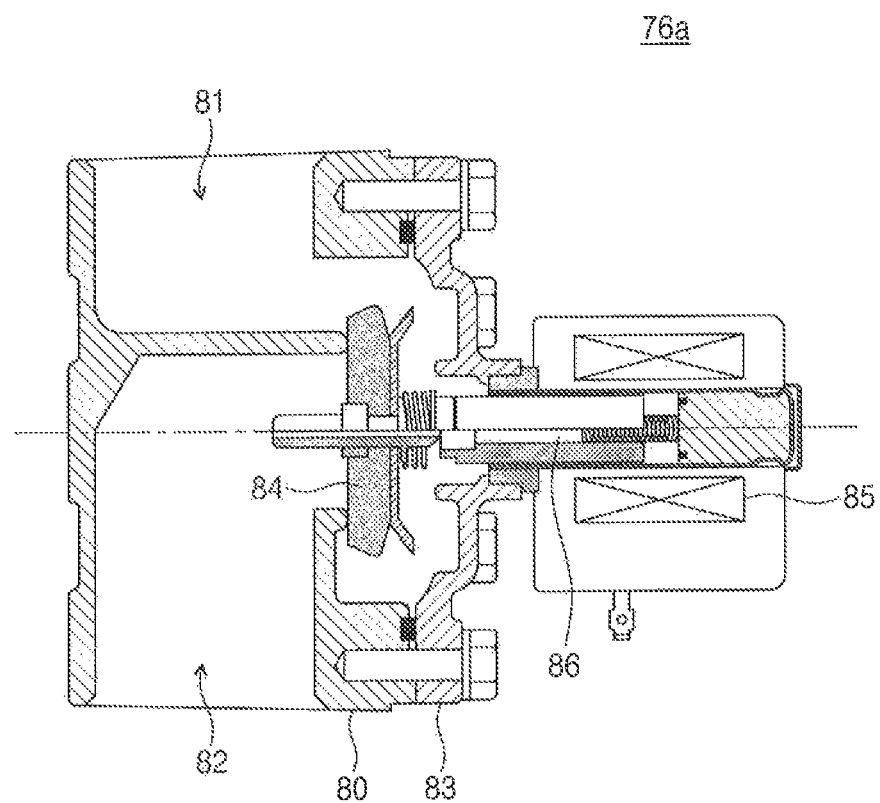
FIG. 5 is a cross-sectional view illustrating an exemplary embodiment of first and second relief valves of FIG. 1.

FIG. 5 illustrates an exemplary embodiment of the first and second relief valves 76 and 78 of FIG. 1.

Referring to FIGS. 1 and 5, the first and second relief valves 76 and 78 may be solenoid valves 76a. According to pressure detection signals of the first and second pipe pressure sensors 72 and 74, the solenoid valve 76a may adjust flow rates of the first and second gases 26 and 28. The first and second relief valves may bypass and/or discharge the first and second gases 26 and 28. A first gas inlet 81 and a first gas outlet 82 of the solenoid valve 76a may be connected between a first valve body 80 and a first cover 83. A disc 84 may be disposed between the first gas inlet 81 and the first gas outlet 82. The disc 84 and a first core shaft 86 may he moved according to a current supplied to a coil 85. A control unit (not shown) may control the current. A discharge amount of the first and second gases 26 and 28 may be controlled proportionally by adjusting a distance between the disc 84 and the first valve body 80.

The first and second relief valves 76 and 78 may be controlled by a predetermined pressure.

Figure 6:
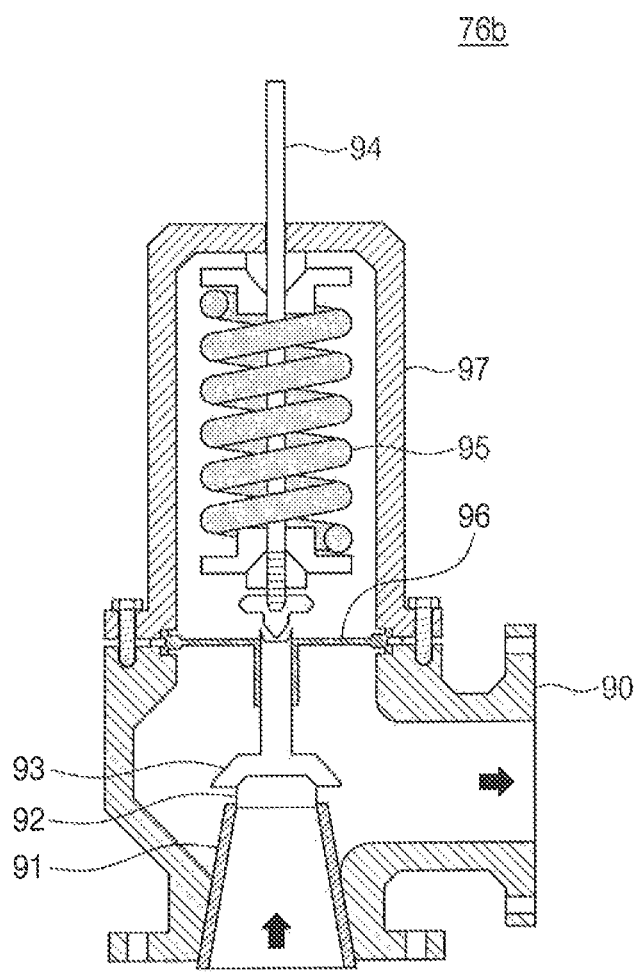
FIG. 6 is a cross-sectional view illustrating an exemplary embodiment of first and second relief valves of FIG. 1.

FIG. 6 illustrates an exemplary embodiment of the first and second relief valves 76 and 78 of FIG. 1.

Referring to FIGS. 1 and 6, the first and second relief valves 76 and 78 may be spring valves 76b. The spring valve 76b may bypass and/or discharge the first and second gases 26 and 28 when pipe pressures of the first and second supply pipes 32 and 34 are above a predetermined pressure. An exhaust pressure of the spring valve 76b may be equal to an internal pressure of the chamber 10. A valve seal 92 of the spring valve 76b may turn a flow of the first and second gases 26 and 28 on and off. The valve seal 92 may be disposed on an inlet nozzle 91 in a second valve body 90. The valve seal 92 may open and close the inlet nozzle 91 through a seal holder 93 and a second core shaft 94. A movement of the second core shaft 94 may be controlled by an elastic force of a spring 95. The elastic force may be in proportion to a length of the spring 95. The length of the spring 95 may be in proportion to a size of an inner space of a second cover 97 on the second valve body 90. Inner spaces of the second cover 97 and the second valve body 90 may be separated by a seal member 96. When pressures of the first and second gases 26 and 28 in the first and second supply pipes 32 and 34 are greater than the elastic force of the spring 95, the first and second gases 26 and 28 may be discharged through the inlet nozzle 91 and the valve seal 92.

A substrate manufacturing method using the substrate manufacturing apparatus according to an exemplary embodiment of the present inventive concept will be described in more detail below.

Figure 7:
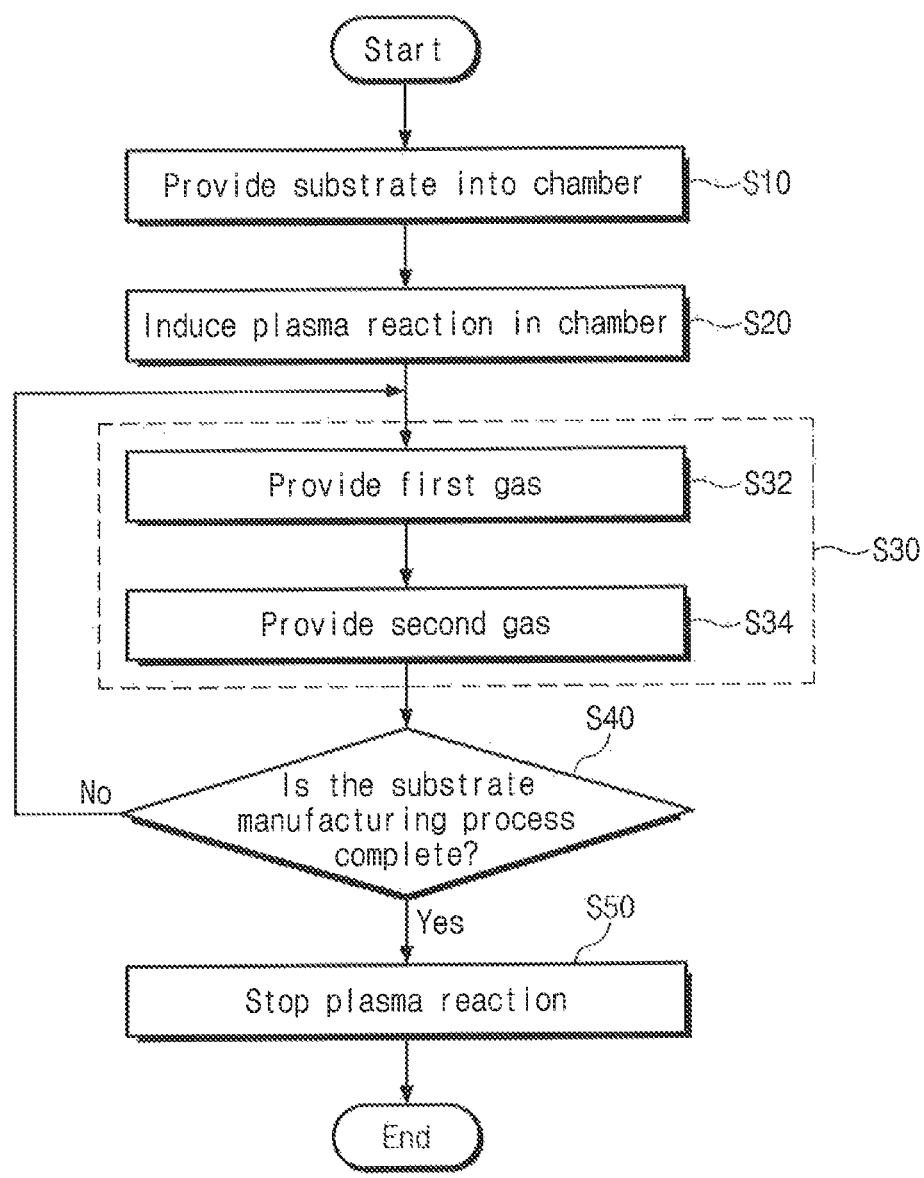
FIG. 7 is a flowchart showing a substrate manufacturing method according to an exemplary embodiment of the present inventive concept.

FIG. 7 is a flowchart showing a substrate manufacturing method according to an exemplary embodiment of the present inventive concept. The substrate manufacturing method may include providing the substrate into the chamber S10, inducing a plasma reaction S20, providing the first gas and the second gas S30 (e.g., alternatively providing the first gas S32 and the second gas S34), determining if the substrate manufacturing process is complete S40, and stopping the plasma reaction S50.

The operation S10 may include loading the substrate 110 into the chamber 10. When the substrate 110 is loaded into the chamber 10, the chamber 10 may have a low vacuum state after high-vacuum pumping. The operation S20 may include inducing the plasma reaction in the chamber 10. The plasma reaction may be induced by high-frequency power of the first and second electrodes 16 and 18. The operation S30 may include alternately providing the first and second gases 26 and 28 into the chamber 10 periodically without stopping the plasma reaction. The operation S30 may include providing the first gas 26 (e.g., S32) and providing the second gas 28 (e.g., S34). For example, each of the first and second gases 26 and 28 may be periodically provided into the chamber 10 about every 1 to about every 20 seconds. When the first gas 26 and the second gas 28 are repeatedly provided about 30 to about 100 times for about 3 minutes to about 15 minutes, the substrate manufacturing process may be completed S40, and the plasma reaction may be stopped S50.

Figure 8:
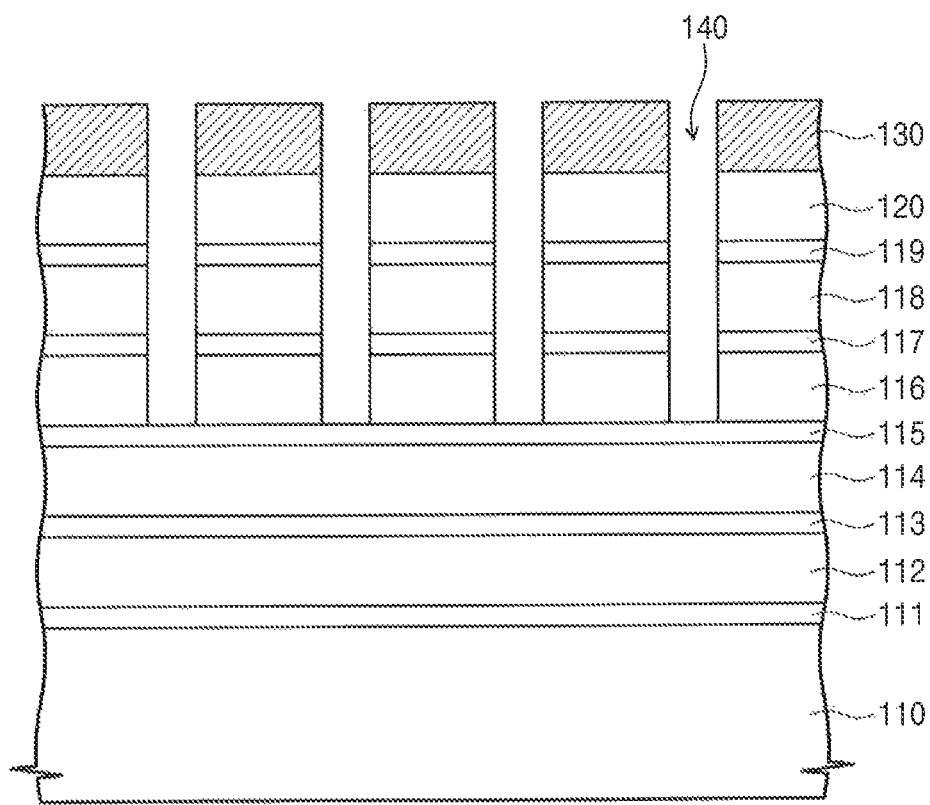
FIGS. 8 to 10 are cross-sectional views illustrating a trench formed by alternately providing first and second gases in FIG. 7.
Figure 9:
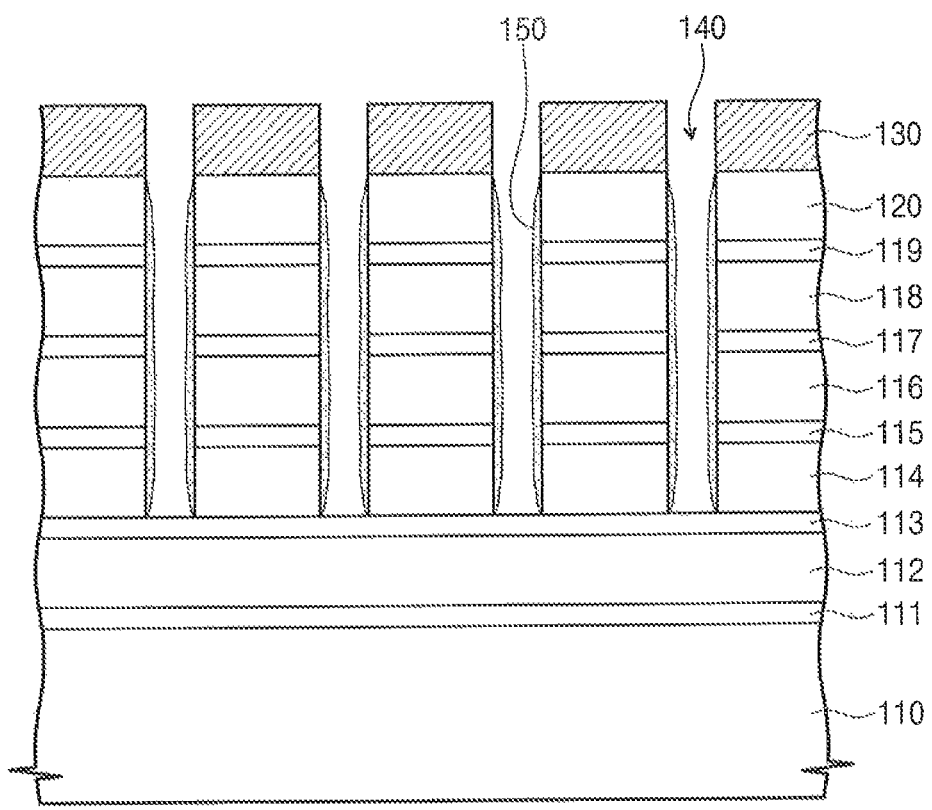
Figure 10:
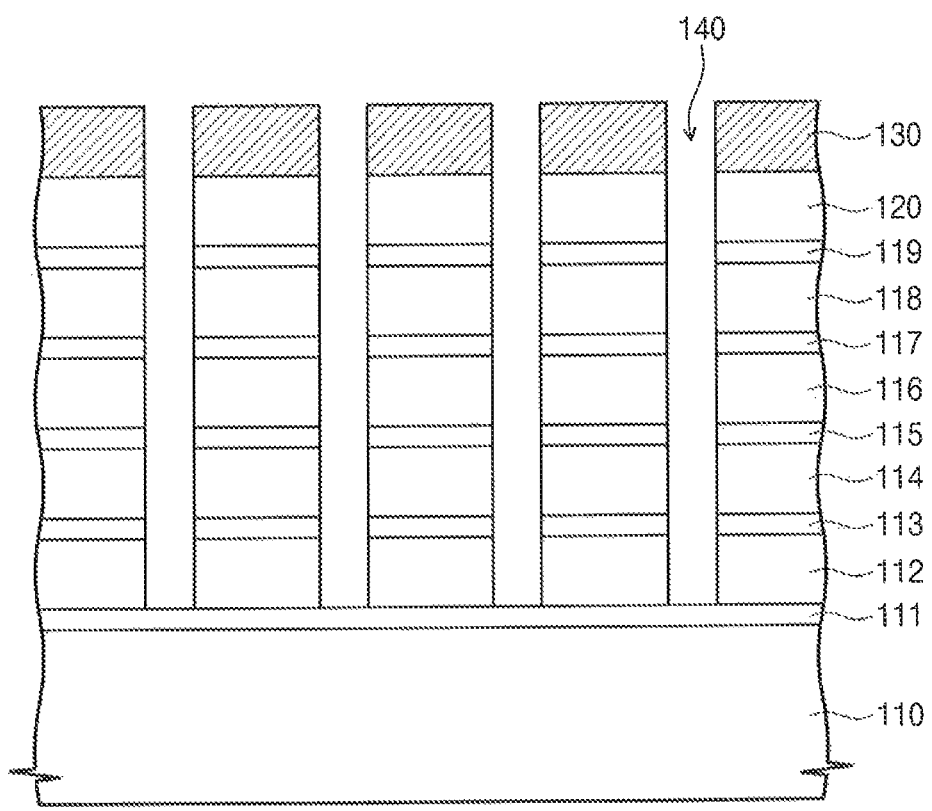

FIGS. 8 to 10 illustrate a trench 140 formed through the operation S30 of alternately providing the first and second gases 26 and 28 in FIG. 7.

Referring to FIG. 8, the first and second gases 26 and 28 may sequentially remove first to tenth thin-film layers 111 to 120 exposed by a mask film 130 disposed on the substrate 110, thereby forming the trench 140. Alternately providing the first and second gases 26 and 28 S30 may form the trench 140. The substrate 110 may include a silicon wafer. The first to tenth thin-film layers 111 to 120 may include conductive layers and dielectric layers, which may be disposed on the substrate 110. For example, the first thin-film layer 111, the third thin-film layer 113, the fifth thin-film layer 115, the seventh thin-film layer 117, and the ninth thin-film layer 119 may be conductive layers. The second thin-film layer 112, the fourth thin-film layer 114, the sixth thin-film layer 116, the eighth thin-film layer 118, and the tenth thin-film layer 120 may be dielectric layers. The mask film 130 may be formed on the tenth layer 120. The mask film 130 may be a hard mask film. As a depth of the trench 140 gradually increases, the first to tenth thin-film layers 111 to 120 may be sequentially exposed at a sidewall and bottom of the trench 140. For example, the trench 140 may expose the fifth thin-film layer 115. The trench 140 may be formed in the substrate 110 or in a single thin-film layer disposed on the substrate 110. The single thin-film layer may include a dielectric material. According to an exemplary embodiment of the present inventive concept, the first and second gases 26 and 28 may include a carbon fluoride (CF) gas.

Referring to FIG. 9, the first gas may form a polymer 150 on the sidewall of the trench 140. The first gas 26 may be provided at a first pressure. The polymer 150 may be formed by providing the first gas 26 (e.g., S32). The first gas 26 may etch the fourth and fifth thin-film layers 114 and 115 disposed on the bottom of the trench 140 and may generate the polymer 150. The first gas 26 may include a deposition gas which does not etch the firth to tenth thin-film layers 111 to 120 but deposits the polymer 150. According to an exemplary embodiment of the present inventive concept, the first gas 26 may include a polymer rich gas. The polymer 150 may be deposited mainly on the sidewall of the trench 140 as by-products created by etching the first to tenth thin-film layers 111 to 120. The polymer 150 may prevent the sidewall of the trench 140 from being over-etched.

Referring to FIG. 10, the second gas 28 may remove the polymer 150 from the sidewall of the trench 140. The second gas 28 may remove the second and third thin-film layers 112 and 113 disposed on the bottom of the trench 140. The depth of the trench 140 may increase without etching the sidewall of the trench 140. The bottom of the trench 140 and the polymer 150 may be etched by providing the second gas 28 (e.g., S32). The second gas 28 may be provided at a second pressure which is different from the first pressure of the first gas 26.

According to an exemplary embodiment of the present inventive concept, the second gas 28 may include more fluorine than the first gas 26. The second gas 28 may include a polymer lean gas.

Figure 11:
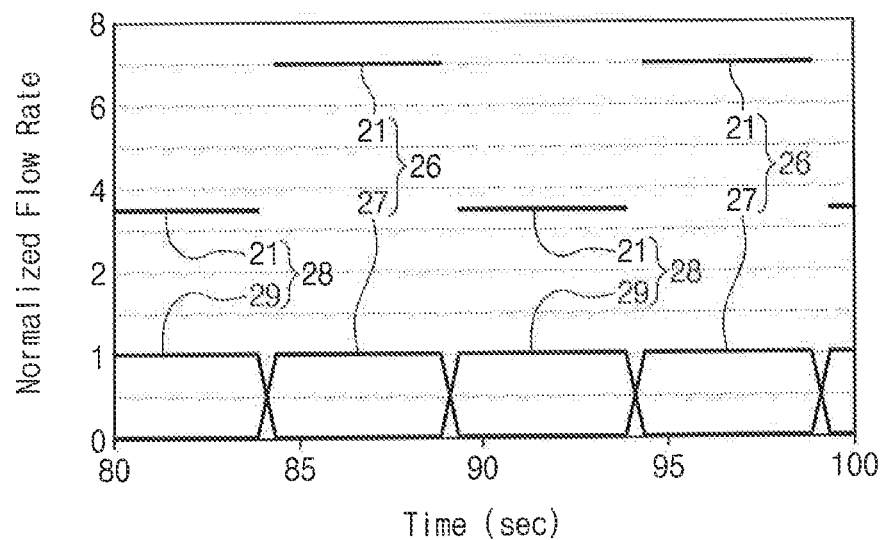
FIG. 11 is a graph showing components and flow rates of first and second gases.

FIG. 11 shows flow rates of the first and second gases 26 and 28. A horizontal axis represents a time and a vertical axis represents a normalized flow rate. The first gas 26 may include a first etching gas 27 and an inert gas 21. The inert gas 21 may include an argon gas. According to an exemplary embodiment of the present inventive concept, the inert gas 21 may be greater in quantity than the first etching gas 27. For example, the inert gas 21 may be about 7 times greater in quantity than the first etching gas 27.

The second gas 28 may include a second etching gas 29 and an inert gas 21. According to an exemplary embodiment of the present inventive concept, the first and second etching gases 27 and 29 may be provided at the same flow rate. The inert gas 21 may be greater in quantity than the second etching as 29. For example, the inert gas 21 may be about 3.5 times greater in quantity than the second etching gas 29.

The inert gas 21 may dilute the first and second etching gases 27 and 29. The inert gas 21 of the first gas 26 may be greater in quantity than the inert gas 21 of the second gas 28. The first etching gas 27 may form more of the polymer 150 including carbon components than the second etching gas 29 because the first etching gas 27 may be more diluted than the second etching gas 29 by the inert gas 21.

Figure 12:
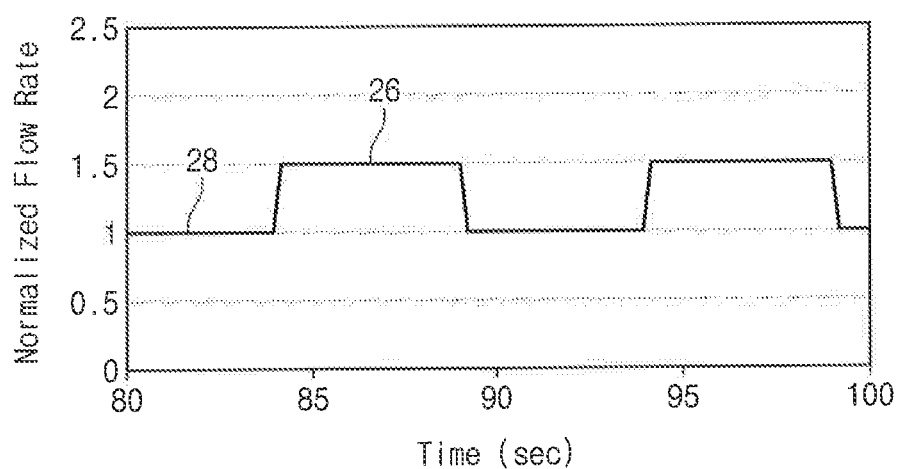
FIG. 12 is a graph showing flow rates of the first and second gases of FIG. 11.

FIG. 12 shows feed flow rates of the first and second gases 26 and 28. The feed flow rates of the first and second gases 26 and 28 may be represented by a square-wave pulse. According to an exemplary embodiment of the present inventive concept, the first gas 26 may be provided in a quantity that is about 1.5 times greater than the second gas 28. For example, the first gas 26 may be provided at a flow rate of from about 20% to about 50% greater than that of the second gas 28.

Figure 13:
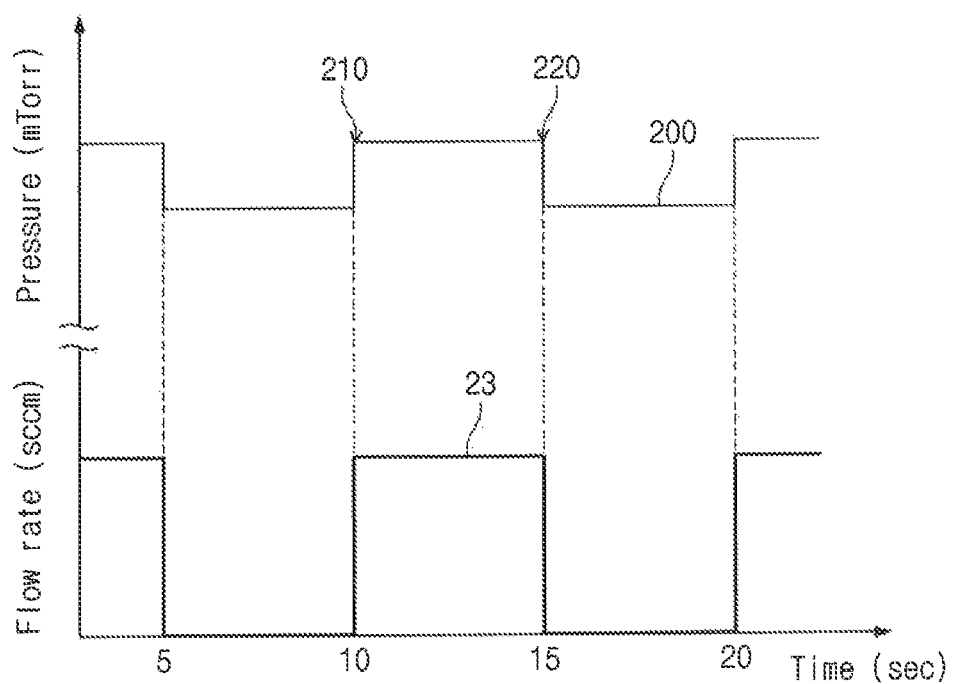
FIGS. 13 and 14 are graphs showing a cross-feed pressure pulse in a chamber according to a feed flow rate of each of a first gas and a second gas.
Figure 14:
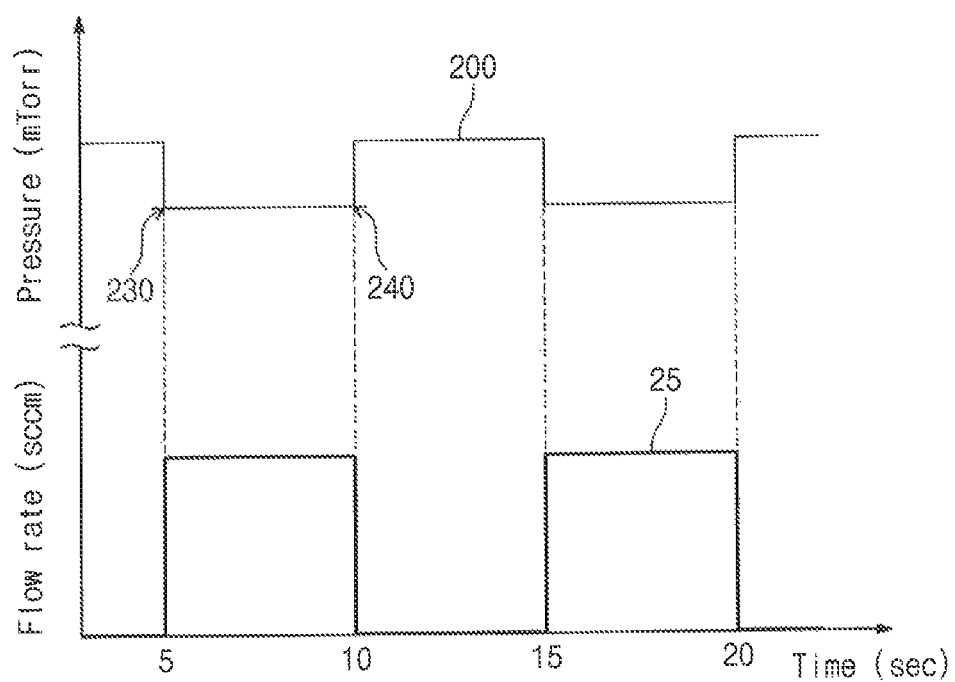

FIGS. 13 and 14 show the stabilized cross-feed pressure pulse 200 in the chamber 10 according to a feed flow rate of each of the first gas 26 and the second gas 28.

Referring to FIGS. 1 and 13, when the first gas 26 is provided into the chamber 10, the stabilized cross-feed pressure pulse 200 may have a first initial feed pressure value 210 and a final feed pressure value 220 of the first gas 26, which may be equal to each other, and might not have any fluctuation. The stabilized cross-feed pressure pulse 200 may have a square-wave shape. The stabilized cross-feed pressure pulse 200 may be aligned with a first gas supply pulse 23.

Referring to FIGS. 1 and 14, when the second gas 28 is provided into the chamber 10, the stabilized cross-feed pressure pulse 200 having a square-wave shape may have a second initial feed pressure value 230 and a final feed pressure value 240 of the second gas 28, which may be equal to each other, and might not have any fluctuation. The stabilized cross-feed pressure pulse 200 may be aligned with a second gas supply pulse 25.

Figure 15:
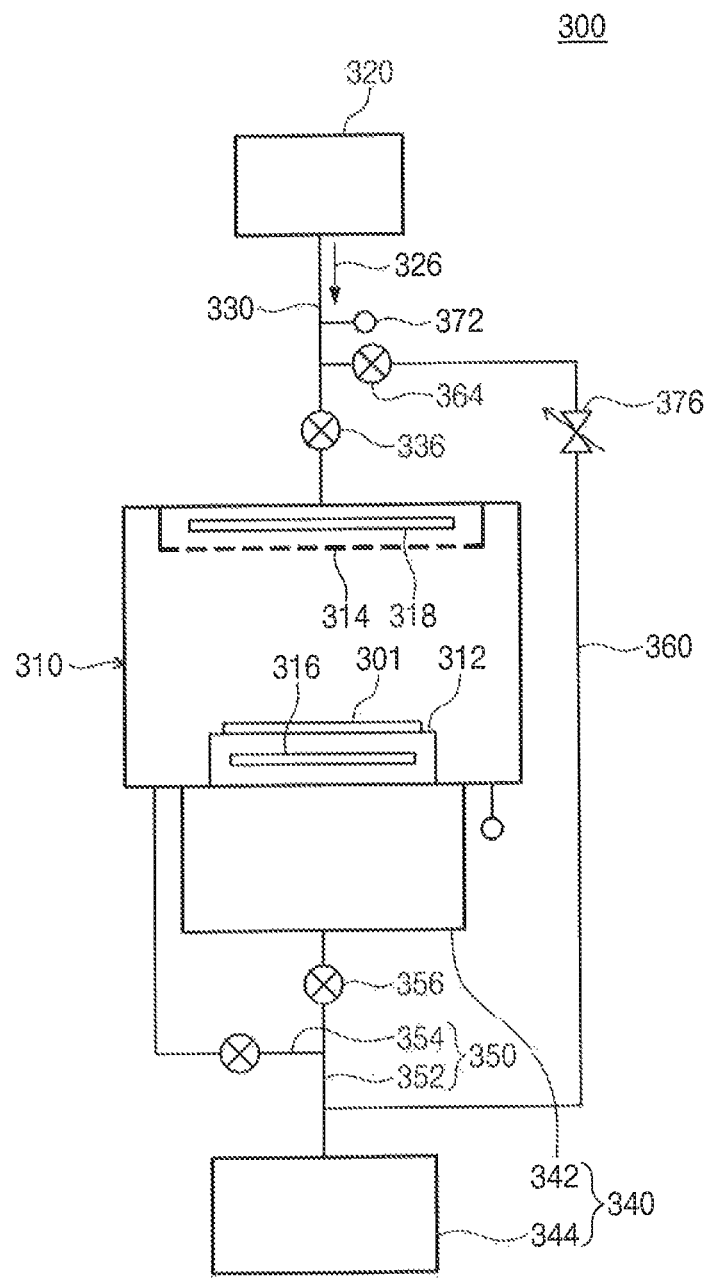
FIG. 15 illustrates a substrate manufacturing apparatus according to an exemplary embodiments of the present inventive concept.

FIG. 15 illustrates a substrate manufacturing apparatus 300 according to an exemplary embodiment of the present inventive concept. The substrate manufacturing apparatus 300 may include a reaction gas supply unit 320 for providing a single reaction gas 326 to a chamber 310, a reaction gas supply pipe 330, a reaction gas supply valve 336, a reaction gas bypass pipe 360, a reaction gas bypass valve 364, and a reaction gas relief valve 376. The chamber 310, pumps 340, an exhaust pipe 350, and a substrate 301 may be substantially the same as those described above with reference to FIG. 1, and detailed descriptions thereof may be omitted.

The reaction gas supply unit 320 may supply the reaction gas 326 to the chamber 310. The reaction gas 326 may include an etching gas or a deposition gas. The reaction gas supply pipe 330 may connect the reaction gas supply unit 320 to the chamber 310. The reaction gas supply valve 336 may turn a supply of the reaction gas 326 on and off. The reaction gas bypass pipe 360 may be branched off from the reaction gas supply pipe 330 and may be connected to the exhaust pipe 350. The reaction gas bypass valve 364 may turn exhaust of the reaction gas 326 in the reaction gas bypass pipe 360 on and off. The reaction gas 326 may be periodically provided into the chamber 310. The reaction gas supply valve 336 and the reaction gas bypass valve 364 may be opened and closed alternately. The reaction gas relief valve 376 may reduce a decrease in an exhaust pressure of the reaction gas 326 in the reaction gas bypass pipe 360 when the reaction gas bypass valve 364 is opened. The reaction gas relief valve 376 may stabilize a feed pressure of the reaction gas 326 in the reaction gas supply pipe 330.

Figure 16:
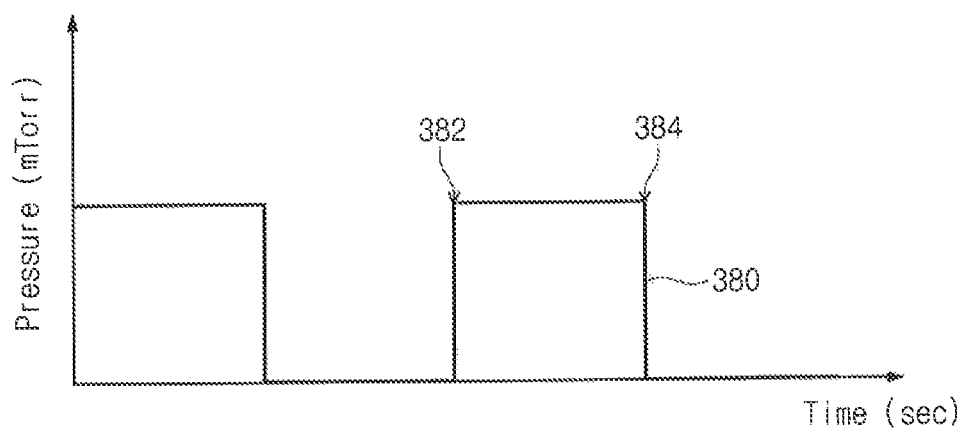
FIG. 16 is a graph showing a feed pressure pulse of a reaction gas in the chamber illustrated in FIG. 15.

FIG. 16 shows a feed pressure pulse 380 of the reaction gas 326 in the chamber 310 of FIG. 15. The reaction gas 32.6 may be provided into the chamber 310 according to the feed pressure pulse 380. The feed pressure pulse 380 may have a substantially square-wave shape. The reaction gas 326 may be provided at a stabilized feed pressure of the feed pressure pulse 380 without fluctuation. The reaction gas 326 of the stabilized feed pressure may reduce or prevent the occurrence of a plasma process defect.

The feed pressure pulse 380 may have an initial feed pressure value 382 and a final feed pressure value 384. The initial and final feed pressure values 382 and 384 of the feed pressure pulse 380 having a square-wave shape may be equal to each other.

A substrate manufacturing apparatus according to an exemplary embodiment of the present inventive concept may include relief valves coupled to gas bypass pipes. The relief valves may reduce a decrease in an exhaust pressure of gases in the gas bypass pipes and may thereby stabilize a feed pressure of the gases provided into the chamber. The gases of the stabilized feed pressure may reduce or eliminate fluctuation of a cross-feed pressure pulse thereof and thus may reduce or prevent the occurrence of a plasma process defect.

While the present inventive concept has been particularly shown and described with reference to exemplary embodiments thereof, it will be understood by those of ordinary skill in the art that various changes in form and detail may be made therein without departing from the spirit and scope of the present inventive concept.

What is claimed is:

1. A substrate manufacturing apparatus, comprising:
   a chamber;
   first and second gas supply units configured to provide first and second gases into the chamber, respectively;
   first and second supply pipes connecting the first and second gas supply units to the chamber, respectively;
   a pump configured to pump the first and second gases in the chamber;
   an exhaust pipe connecting the pump and the chamber;
   first and second bypass pipes branched off from the first and second supply pipes, wherein the first and second bypass pipes are connected to the exhaust pipe, and wherein each of the first and second bypass pipes bypass the chamber;
   first and second main supply valves disposed on the first and second supply pipes, respectively, between the chamber and the first and second bypass pipes, wherein, the first and second main supply valves are configured to turn on and off a supply of the first and second gases, respectively; and first and second relief valves disposed on the first and second bypass pipes, respectively, wherein the first and second relief valves are configured to respectively reduce a decrease in an exhaust pressure of each of the first and second gases in the first and second bypass pipes, and wherein the first and second relief valves are configured to stabilize a feed pressure of each of the first and second gases to have a substantially square wave transition profile.

2. The substrate manufacturing apparatus of claim 1, further comprising first and second bypass valves disposed on the first and second bypass pipes between the first and second supply pipes and the first and second relief pipes, respectively, wherein the first and second bypass valves are configured to turn on and off an exhaust of the first and second gases discharged to the first and second bypass pipes, respectively.

3. The substrate manufacturing apparatus of claim 2, wherein the first and second relief valves are configured to reduce a decrease in an exhaust pressure of each of the first and second gases in the first and second supply pipes when the first and second relief valves are opened.

4. The substrate manufacturing apparatus of claim 1, wherein each of the first and second relief valves comprises a pressure regulating valve.

5. The substrate manufacturing apparatus of claim 1, further comprising first and second pipe pressure sensors disposed on the first and second supply pipes between the first and second gas supply units and the first and second bypass pipes, respectively, wherein the first and second pipe pressure sensors are configured to detect pressures of the first and second gases in the first and second supply pipes, respectively.

6. The substrate manufacturing apparatus of claim 5, wherein the first and second relief valves further comprise solenoid valves which are opened and closed to be interlocked with the first and second pressure sensors, respectively.

7. The substrate manufacturing apparatus of claim 1, wherein each of first and second relief valves comprises a spring valve configured to be opened and closed according to pressures of the first and second cases in the first and second bypass pipes.

8. The substrate manufacturing apparatus of claim 1, wherein the first main supply valve and the second main supply valve are configured to be opened and closed alternately at the same time, wherein the first main supply valve and the second bypass valve are configured to be opened and closed at the same time, and wherein the second main supply valve and the first bypass valve are configured to be opened and closed at the same time.

9. The substrate manufacturing apparatus of claim 1, wherein the first and second relief vales each comprise a solenoid valve.

10. The substrate manufacturing apparatus of claim 1, wherein the first and second relief vales each comprise a spring valve.

11. A substrate manufacturing apparatus, comprising:
a chamber;
a reaction gas supply pipe connecting a reaction gas supply unit to the chamber;
a reaction gas supply valve disposed on the reaction gas supply pipe, wherein the reaction gas supply valve is configured to periodically turn a flow of a reaction gas into the chamber on and off;
a reaction gas bypass pipe branched off from the reaction gas supply pipe, wherein the reaction gas bypass pipe is connected to an exhaust pipe, and wherein the reaction gas bypass pipe is configured to bypass the chamber;
a reaction gas bypass valve disposed on the reaction gas bypass pipe, wherein the reaction gas bypass valve is configured to turn on and off an exhaust of the reaction gas into the reaction gas bypass pipe, and wherein the reaction gas bypass valve is configured to regulate the flow of the reaction gas into the chamber to have a stable feed pressure; and
a reaction gas relief valve disposed on the reaction gas bypass pipe.

12. The substrate manufacturing apparatus of claim 11, wherein the reaction gas relief valve is configured to decrease an exhaust pressure of the reaction gas in the reaction gas bypass pipe.

13. The substrate manufacturing apparatus of claim 11, wherein the reaction gas relief valve is configured to further stabilize the feed pressure of the reaction gas in the reaction supply pipe.

14. The substrate manufacturing apparatus of claim 11, further comprising an exhaust pipe connected to the chamber and a pump connected to the exhaust pipe.

* * * * *